(12) United States Patent
Barkarö

(10) Patent No.: US 6,407,578 B2
(45) Date of Patent: Jun. 18, 2002

(54) ARRANGEMENT FOR REDUCING POWER DISSIPATION IN A LINE DRIVER

(75) Inventor: Stefan Barkarö, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/727,694

(22) Filed: Dec. 4, 2000

(30) Foreign Application Priority Data

Dec. 17, 1999 (SE) .............................................. 9904642

(51) Int. Cl.$^7$ .......................................... H03K 19/0175
(52) U.S. Cl. ............................ 326/80; 326/82; 326/83; 375/295
(58) Field of Search ............................. 326/80, 81, 82, 326/83; 375/257, 377, 286, 219, 295

(56) References Cited

U.S. PATENT DOCUMENTS

| | | | |
|---|---|---|---|
| 5,585,744 A | | 12/1996 | Runas et al. |
| 5,604,924 A | * | 2/1997 | Yokoya ........................ 455/68 |
| 6,163,706 A | * | 12/2000 | Rozenbilt et al. ........... 455/522 |
| 6,282,273 B1 | * | 8/2001 | McHale et al. ........... 379/93.01 |
| 6,323,686 B1 | * | 11/2001 | Bisson et al. ................. 326/26 |

FOREIGN PATENT DOCUMENTS

WO 99/18662 A1 4/1999

OTHER PUBLICATIONS

Do et al. High Efficiency Line Drive for High Crest-Factor Signals Such As DMT/ADSL Signals (Aug. 20, 2001), Continuation of U.S. Patent application No.09/419,707.*

* cited by examiner

*Primary Examiner*—Michael Tokar
*Assistant Examiner*—Steven S. Paik
(74) *Attorney, Agent, or Firm*—Nixon & Vanderhye P.C.

(57) ABSTRACT

To reduce power dissipation in a line driver connected to a transmission line for transmitting multitone signals in the form of successive symbols separated by cyclic prefixes and generated by a digital signal processor, a controllable voltage supply is connected with its output terminal to a supply voltage terminal of the line driver. In response to an expected peak-to-peak value of the next symbol to be transmitted, the digital signal processor controls the controllable voltage supply during each cyclic prefix to set an appropriate supply voltage to the line driver.

17 Claims, 1 Drawing Sheet

ARRANGEMENT FOR REDUCING POWER DISSIPATION IN A LINE DRIVER

TECHNICAL FIELD

The invention relates generally to line drivers, and more specifically to an arrangement for reducing power dissipation in line drivers connected to transmission lines in multitone systems, such as e.g., ADSL (Asymmetric Digital Subscriber Line) systems.

BACKGROUND OF THE INVENTION

In a multitone system, such as an ADSL-system, data information is randomly coded into the phase and amplitude of a plurality of sine tones that are transmitted by line drivers on transmission lines in bursts with a so-called symbol rate or length, which in the ADSL case is 246.3 $\mu s$. To enable Fourier transformations to be made on each symbol, a so-called cyclic prefix is inserted between the symbols. The cyclic prefix does not contain any valid data but ensures that the multitone signal appears continuous for the Fourier transformation. In the ADSL case, each cyclic prefix has a length of 32 samples or about 15 $\mu s$.

Since the phase and amplitude of each individual tone can be seen as random and the total signal consists of a sum of many tones, there will be a great difference between successive symbols in the peak-to-peak voltage of the total signal that is to be transmitted. In typical ADSL systems, the supply voltage of the line drivers that are connected to the transmission line for transmitting multitone signals must be selected such that the theoretical maximum peak can be transmitted without being clipped. But this causes the supply voltage of the line driver to be far too high for the majority of the symbols that are transmitted. Consequently, the power dissipation in the line driver will be higher than necessary for most of the symbols.

SUMMARY OF THE INVENTION

An object of the invention is to reduce the power dissipation in such line drivers. The supply voltage to the line driver is controlled from symbol-to-symbol during the cyclic prefixes in response to a known, expected, peak-to-peak value of the next symbol to be transmitted. By adapting the supply voltage to expected peak-to-peak values, the power dissipation is reduced in the line driver.

BRIEF DESCRIPTION OF THE DRAWING

The invention will be described more in detail below with reference to the appended drawings in which.

DESCRIPTION OF THE INVENTION

Figure 1:
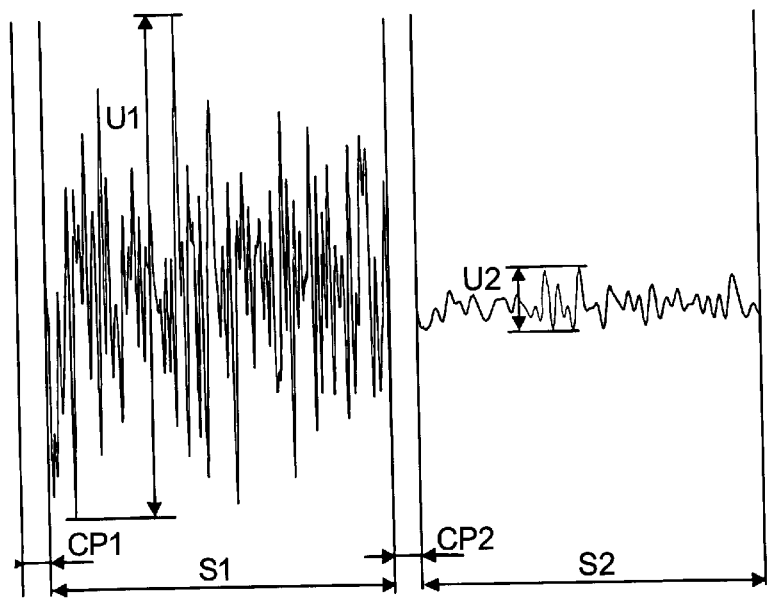
FIG. 1 schematically illustrates two successive symbols to be transmitted in an ADSL system.

FIG. 1 schematically illustrates two successive symbols S1 and S2 to be transmitted in an ADSL system. In a known manner, each symbol, S1 and S2, is preceded by a so-called cyclic prefix, CP1 and CP2, respectively. In ADSL systems, the symbol length is 246.3 $\mu s$, while the length of the cyclic prefix is 32 samples or about 15 $\mu s$ as already mentioned. In FIG. 1, the peak-to-peak value of the symbol S1 is U1, while the peak-to-peak value of the symbol S2 equals U2, which is a lower value than U1.

Today, the symbols S1 and S2 illustrated in FIG. 1 are transmitted by a line driver having a constant supply voltage, even if they do not require the same supply voltage in order to be transmitted without being clipped. Thus, unnecessary power is consumed in such line drivers.

Figure 2:
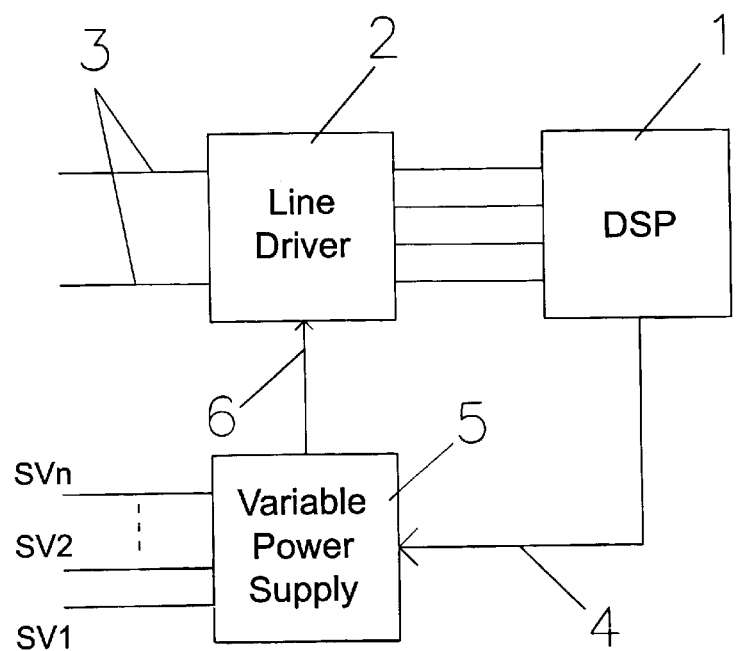
FIG. 2 is a schematic block diagram of one end of an ADSL connection with an example embodiment of an arrangement according to the invention.

In FIG. 2, an example arrangement according to the invention for reducing the power dissipation in a line driver is schematically illustrated. A digital signal processor (DSP) 1 is connected via digital input/output terminals to corresponding output/input terminals of an analog front end or line driver 2 connected to a transmission line 3 for transmitting and receiving data information in the form of symbols, such as those illustrated in FIG. 1.

The line driver 2 includes a digital-to-analog converter (not shown) for converting digital signals from the digital signal processor 1 into analog signals to be transmitted as symbols in accordance with FIG. 1, and an analog-to-digital converter (not shown) for converting received analog symbols into digital signals to the digital signal processor 1. The digital signal processor 1 knows the peak value of the tones to be transmitted in each symbol. Thus, in the example of FIG. 1, the digital signal processor 1 knows the peak value U1 for symbol S1 before S1 is transmitted to the line driver 2 as well as of the peak value U2 of the symbol S2. With this knowledge, the digital signal processor 1 selects an appropriate supply voltage to the driver 2 for each symbol.

In the example embodiment shown in FIG. 2, the digital signal processor 1 is connected via a control bus 4 to a switch 5 which is adapted to apply different supply voltages SV1, SV2 ... SVn to a supply voltage input terminal 6 of the line driver 2 in response to different control signals from the digital signal processor 1 on the control bus 4. In this connection, the different supply voltages need not be fixed and applied by means of a switch. Instead, they may be supplied, e.g., by a controllable DC/DC converter.

The selection of an appropriate supply voltage to the line driver 2 takes place during each cyclic prefix CP1, CP2, i.e., at times when no relevant information is transmitted. Thus, during each cyclic prefix, an appropriate or an optimum supply voltage for the line driver 2 for the next symbol to be transmitted is selected without causing any disturbances. By optimizing the supply voltage for each symbol, the total power dissipation of the driver 2 can be considerably reduced.

While the present invention has been described with respect to particular embodiments, those skilled in the art will recognize that the present invention is not limited to these specific exemplary embodiments. Different formats, embodiments, and adaptations besides those shown and described as well as many variations, modifications, and equivalent arrangements may also be used to implement the invention. Therefore, while the present invention has been described in relation to its preferred embodiments, it is to be understood that this disclosure is only illustrative and exemplary of the present invention. Accordingly, it is intended that the invention be limited only by the scope of the claims appended hereto.

What is claimed is:

1. An arrangement for reducing power dissipation in a line driver coupled to a transmission line for transmitting multitone signals in the form of successive symbols separated by cyclic prefixes generated by a digital signal processor, comprising a controllable voltage supply having an output terminal and a control input terminal, the output terminal of the controllable voltage supply being coupled to a supply voltage terminal of the line driver to supply a controllable supply voltage thereto, and the control input terminal of the digital signal processor, the digital signal processor being adapted to control the controllable voltage supply during each cyclic prefix to control the supply voltage to the line driver in response to a peak-to-peak value of the next symbol to be transmitted.

2. The arrangement according to claim 1, wherein the controllable voltage supply is coupled to the digital signal processor via a control bus.

3. The arrangement according to claim 1, wherein the controllable voltage supply comprises a switch which is adapted to apply different supply voltages to the line driver in response to different peak-to-peak values of the symbols to be transmitted.

4. The arrangement according to claim 1, wherein the controllable voltage supply comprises a DC/DC converter controlled by the digital signal processor.

5. An arrangement for use in a multitone system where symbols are coded into a phase and an amplitude of plural sine tones transmitted in bursts at a particular symbol rate, where a cyclic prefix inserted between each pair of successive symbols is transmitted between bursts, comprising:
   a line driver coupled to a transmission line for transmitting first multitone signals in a first burst corresponding to a first symbol, then transmitting a cyclic prefix, and then transmitting second multitone signals in a second burst corresponding to a second symbol;
   a controllable voltage supply for supplying a controllable supply voltage to the line driver; and
   a controller for controlling the controllable voltage supply during transmission of the cyclic prefix to adjust a supply voltage to the line driver in response to a peak value of the second multitone signal corresponding to the second symbol to be transmitted in the second burst.

6. The arrangement according to claim 5, wherein the controllable voltage supply is coupled to the controller via a control bus.

7. The arrangement according to claim 5, wherein the controller is a digital signal processor configured to supply the line driver with the first symbol, the cyclic prefix, and the second symbol.

8. The arrangement according to claim 5, wherein the multitone system is an asymmetric digital subscriber line (ADSL) system.

9. The arrangement according to claim 8, wherein the first and second bursts are about 246 microseconds long and the cyclic prefix is about 15 microseconds long.

10. The arrangement according to claim 5, wherein adjusting the supply voltage to the line driver in response to a peak value of the second multitone signal reduces power dissipation in the line driver.

11. The arrangement in claim 5, wherein the peak value is a peak-to-peak value.

12. A method for use in a multitone system comprising:
   coding symbols into a phase and an amplitude of plural sine tones, successive symbols being separated by a cyclic prefix;
   transmitting first multitone signals in a first burst corresponding to a first symbol over a transmission line using a line driver;
   transmitting a cyclic prefix over the transmission line using the line driver;
   transmitting second multitone signals in a second burst corresponding to a second symbol over the transmission line using the line driver; and
   supplying a voltage to the line driver at a first voltage level during the first burst, and during transmission of the cyclic prefix, adjusting the voltage to the line driver to a second voltage level based on a peak value of the second multitone signal corresponding to the second symbol to be transmitted in the second burst.

13. The method according to claim 12, wherein the controllable voltage supply is coupled to the controller via a control bus.

14. The method according to claim 12, wherein the multitone system is an asymmetric digital subscriber line (ADSL) system.

15. The method according to claim 14, wherein the first and second bursts are about 246 microseconds long and the cyclic prefix is about 15 microseconds long.

16. The method according to claim 12, wherein adjusting the supply voltage to the line driver in response to a peak value of the second multitone signal reduces power dissipation in the line driver.

17. The method according to claim 12, wherein the peak value is a peak-to-peak value.

* * * * *